(12) United States Patent
Peng et al.

(10) Patent No.: US 12,489,430 B2
(45) Date of Patent: Dec. 2, 2025

(54) LOCK-UP LATCH FOR DUAL-EDGE-TRIGGERED FLIP-FLOPS

(71) Applicant: QUALCOMM Incorporated, San Diego, CA (US)

(72) Inventors: Yimai Peng, Cary, NC (US); Robert Joseph Vachon, Zebulon, NC (US); Daniel Yingling, Apex, NC (US); Keith Alan Bowman, Morrisville, NC (US)

(73) Assignee: QUALCOMM INCORPORATED, San Diego, CA (US)

( * ) Notice: Subject to any disclaimer, the term of this patent is extended or adjusted under 35 U.S.C. 154(b) by 126 days.

(21) Appl. No.: 18/537,583

(22) Filed: Dec. 12, 2023

(65) Prior Publication Data

US 2025/0192757 A1    Jun. 12, 2025

(51) Int. Cl.
 *H03K 3/037* (2006.01)
 *G01R 31/3177* (2006.01)
 *G01R 31/3185* (2006.01)

(52) U.S. Cl.
 CPC .......... *H03K 3/037* (2013.01); *G01R 31/3177* (2013.01); *G01R 31/318541* (2013.01); *G01R 31/318552* (2013.01); *G01R 31/318594* (2013.01)

(58) Field of Classification Search
 None
 See application file for complete search history.

(56) References Cited

U.S. PATENT DOCUMENTS

| | | | |
|---|---|---|---|
| 7,447,961 B2* | 11/2008 | Tan | G01R 31/318541 714/731 |
| 8,788,896 B2* | 7/2014 | Tekumalla | G01R 31/318541 714/30 |
| 9,599,672 B2* | 3/2017 | Abhishek | G01R 31/318552 |
| 9,798,352 B1 | 10/2017 | Majumdar et al. | |
| 12,224,752 B1* | 2/2025 | Peng | H03K 3/0372 |
| 2004/0041610 A1 | 3/2004 | Kundu | |
| 2016/0169966 A1 | 6/2016 | Abshishek et al. | |

OTHER PUBLICATIONS

International Search Report and Written Opinion—PCT/US2024/057534—ISA/EPO—Mar. 11, 2025.

* cited by examiner

*Primary Examiner* — Cassandra F Cox
(74) *Attorney, Agent, or Firm* — Loza & Loza, LLP

(57) ABSTRACT

An apparatus, including: a first flip-flop including a scan input configured to receive a scan signal, a clock input configured to receive a first clock signal of a first clock domain; a latch including an input coupled to an output of the first flip-flop, a clock input configured to receive a control signal; and a second flip-flop including a scan input coupled to an output of the latch, a clock input configured to receive a second clock signal of a second clock domain, and an output configured to generate the scan signal, wherein at least one of the first or second flip-flop comprises a first dual-edge-triggered (DET) flip-flop.

13 Claims, 8 Drawing Sheets

LOCK-UP LATCH FOR DUAL-EDGE-TRIGGERED FLIP-FLOPS

FIELD

Aspects of the present disclosure relate generally to data processing circuits, and in particular, to a lock-up latch for dual-edge-triggered (DET) flip-flops (FFs).

BACKGROUND

Functional circuits, such as processors, memory, and others, typically include sequential circuits, such as a network of cascaded and parallel flip-flops, driven by clock signals to move data from inputs to functional subsystems or cores, and to outputs. Such sequential circuits may include design-for-testability (DFT) features including a scan path or pipeline that may traverse a plurality of clock domains.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus including: a first flip-flop including a scan input configured to receive a scan signal, a clock input configured to receive a first clock signal of a first clock domain; a latch including an input coupled to an output of the first flip-flop, a clock input configured to receive a control signal; and a second flip-flop including a scan input coupled to an output of the latch, a clock input configured to receive a second clock signal of a second clock domain, and an output configured to generate the scan signal, wherein at least one of the first or second flip-flop comprises a first dual-edge-triggered (DET) flip-flop.

Another aspect of the disclosure relates to a method. The method includes: operating a first flip-flop to propagate a scan signal from an input to an output based on a first clock signal of a first clock domain; operating a latch to propagate the scan input from an input to an output based on a control signal; and operating a second flip-flop to propagate the scan signal from an input to an output based on a second clock signal of a second clock domain, wherein at least one of the first or second flip-flop comprises a dual-edge-triggered (DET) flip-flop.

Another aspect of the disclosure relates to a wireless communication device. The wireless communication device includes at least one antenna; a transceiver coupled to the at least one antenna; and one or more signal processing cores coupled to the transceiver, wherein the one or more signal processing core comprise: a first flip-flop including a scan input configured to receive a scan signal, a clock input configured to receive a first clock signal of a first clock domain; a latch including an input coupled to an output of the first flip-flop, a clock input configured to receive a control signal; and a second flip-flop including a scan input coupled to an output of the latch, a clock input configured to receive a second clock signal of a second clock domain, and an output configured to generate the scan signal, wherein at least one of the first or second flip-flop comprises a first dual-edge-triggered (DET) flip-flop.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
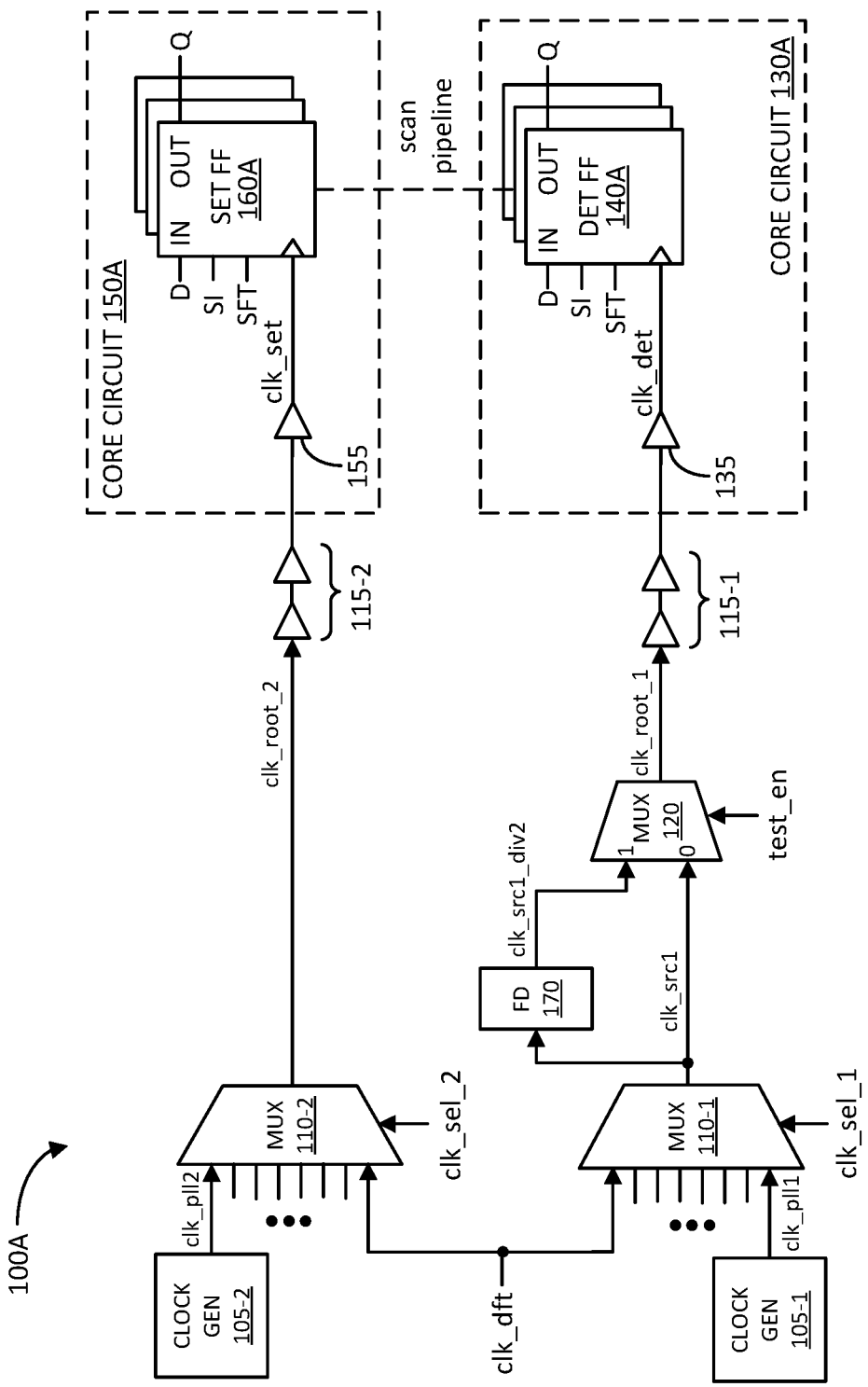
FIGS. 1A-1B illustrate block diagrams of example data processing circuits in accordance with an aspect of the disclosure.

FIG. 1A illustrates a block diagram of an example data processing circuit 100A in accordance with an aspect of the disclosure. In this example, the data processing circuit 100 includes dual-edge-triggered (DET) FFs coupled to single-edge-triggered (SET) FFs via a scan pipeline. The data processing circuit 100A may be applicable to sequential circuits 200 and 300 discussed further herein. The data processing circuit 100A may be implemented in an integrated circuit (IC), such as a system on chip (SOC). It shall be understood that the data processing circuit 100A is merely an example, and many variations with same and/or different components are contemplated.

In particular, the data processing circuit 100A includes a first clock generator (e.g., including a phase locked loop (PLL)) 105-1, a first clock multiplexer 110-1, a frequency divider (FD) 170, a second clock multiplexer 120, and a first set of one or more cascaded buffers 115-1. Similarly, the data processing circuit 100A includes a second clock generator (e.g., including PLL) 105-2, a third clock multiplexer 110-2, and a second set of one or more cascaded buffers 115-2.

Additionally, the data processing circuit 100A includes a first core circuit 130A (e.g., a processor, a central processing unit (CPU), a graphics processing unit (GPU), a digital signal processor (DSP), a memory (e.g., dynamic random access memory (DRAM)), etc.), and a second core circuit 150A (e.g., a processor, a CPU, a GPU, a DSP, a memory (e.g., DRAM, etc.). The first core circuit 130A includes a first clock distribution network or tree 135, and a set of DET flip-flops (FFs) 140A. The second core circuit 150A includes a second clock distribution network or tree 155, and a set of SET flip-flops (FFs) 160A.

The first clock generator 105-1 is configured to generate a first pll-based clock signals clk_pll1. A clock signal, as defined herein, is a substantially periodic voltage waveform (e.g., substantially square wave) used to sequentially control the movement of data (e.g., functional data or scan data) within and/or between the first and second core circuits 130 and 150 in different clock domains, respectively. The first clock multiplexer 110-1 is configured to receive a set of clock signals including the first pll-based clock signal clk_pll1 and a design-for-testability (DFT) clock signal clk_dft. The first clock multiplexer 110-1 is configured to select and output a clock signal clk_src1 based on a first clock select signal clk_sel_1. Similarly, the second clock generator 105-2 is configured to generate a second pll-based clock signals clk_pll2. The third clock multiplexer 110-2 is also configured to receive a set of clock signals including the second pll-based clock signal clk_pll2 and DFT clock signal clk_dft. The third clock multiplexer 110-2 is configured to select and output a clock signal clk_root_2 based on a second clock select signal clk_sel_2.

The frequency divider (FD) 170 is configured to frequency divide the clock signal clk_src1 by a specified divider ratio (e.g., two (2)) to generate a clock signal clk_src1_div2. The second multiplexer 120 is configured to output a clock signal clk_root_1 by selecting clock signal clk_src1 or clk_src1_div2 based on a test enable signal test_en. Via the first set of buffers 115-1 and the clock distribution network 135, a clock signal clk1 based on the clock signal clk_root_1 is provided to the clock inputs of the set of DET FFs 140A. Similarly, via the second set of buffers 115-2 and the clock distribution network 155, a second clock signal clk_set is provided to the clock inputs of the set of SET FFs 160A.

For design-for-testability (DFT) purposes, each of the set of DET FFs 140A includes a scan input (SI) and a shift input (SFT). The SI input is configured to receive a scan signal for propagating the scan signal to or received from a scan pipeline that traverses the first and second core circuits 130A and 150A, as indicated by the dash line labeled "scan pipeline." The scan pipeline may propagate scan data from the set of SET FFs 160A to the DET FFs 140A, or may propagate scan data from the set of DET FFs 140A to the SET FFs 160A. The SFT input is configured to receive a shift control signal for configuring the set of DET FFs 140A in DFT mode when the SFT signal is asserted (e.g., a logic one (1)), where each of the set of DET FFs 140A clocks/propagates the scan signal at its SI input to its output Q; and configuring the set of DET FFs 140A in functional mode when the SFT signal is deasserted (e.g., a logic zero (0)), where each of the set of DET FFs 140A clocks/propagates the data signal at its data (D) input to its respective output Q.

Similarly, each of the set of SET FFs 160A includes a scan input (SI) and a shift input (SFT). The SI input is configured to receive the scan signal for propagating the scan signal received from or to the scan pipeline that traverses the first and second core circuits 130A and 150A. The SFT input is configured to receive a shift control signal for configuring the set of SET FFs 160A in DFT mode when the SFT signal is asserted (e.g., a logic one (1)), where each of the set of SET FFs 160A clocks/propagates the scan signal at its SI input to its output Q; and configuring the set of SET FFs 160A in functional mode when the SFT signal is deasserted (e.g., a logic zero (0)), where each of the set of SET FFs 160A clocks/propagates the data signal at its data (D) input to its respective output Q.

Figure 1B:
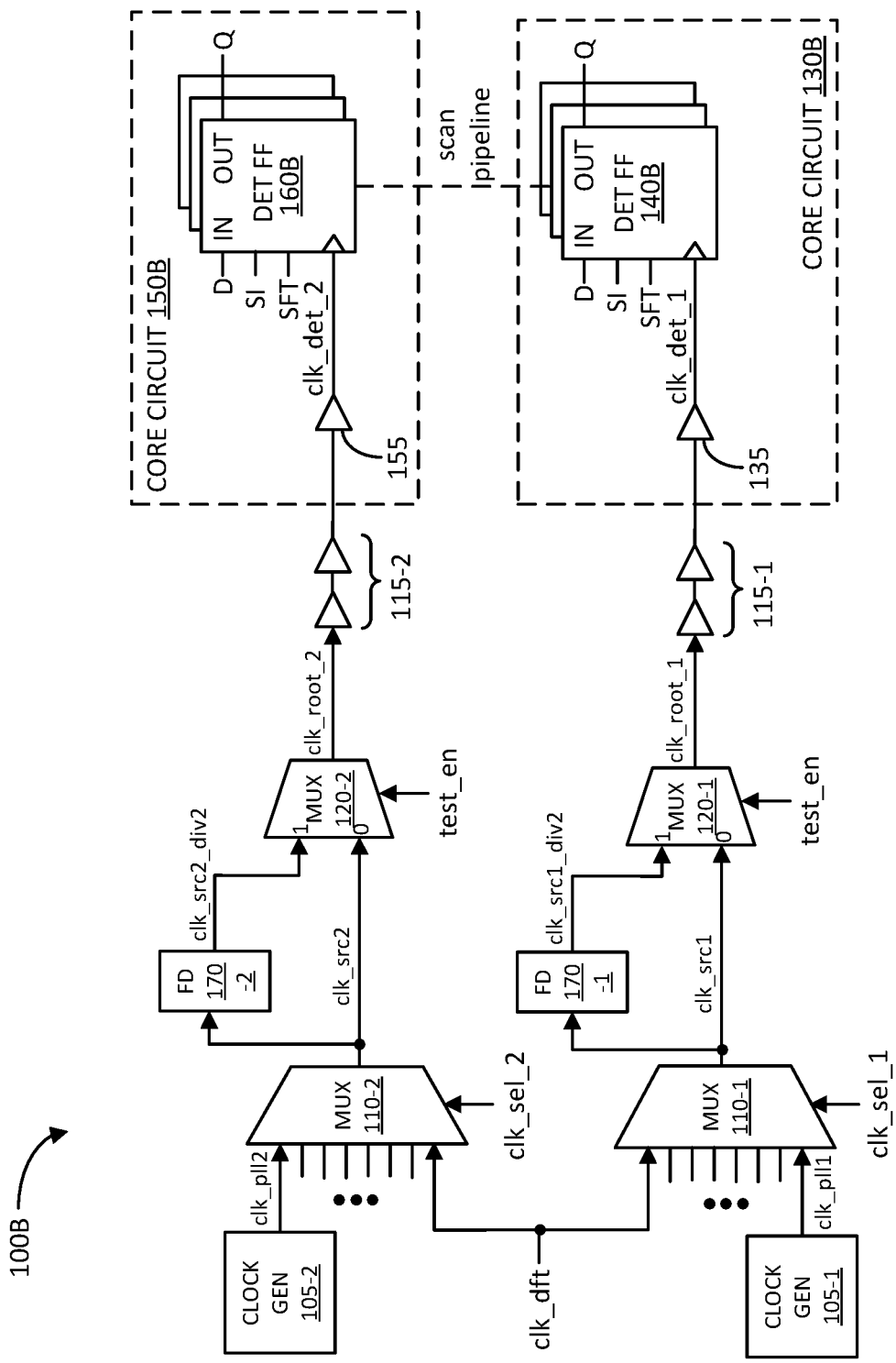

FIG. 1B illustrates a block diagram of another example data processing circuit 100B in accordance with an aspect of the disclosure. In this example, the data processing circuit 100B includes dual-edge-triggered (DET) FFs coupled to DET-edge-triggered (DET) FFs via a scan pipeline. The data processing circuit 100B may be applicable to sequential circuits 400 and 500 discussed further herein. The data processing circuit 100B may be implemented in an integrated circuit (IC), such as a system on chip (SOC). It shall be understood that the data processing circuit 100B merely an example, and many variations with same and/or different components are contemplated. The reference number convention of FIG. 1A is essentially preserved in FIG. 1B for ease of explanation.

For example, the frequency divider (FD) 170 and second multiplexer 120 in FIG. 1A are referred to and relabeled as first frequency divider (FD) 170-1 and second multiplexer 120-1 in FIG. 1B, respectively. The core circuit 130A including the set of DET FFs 140A are relabeled as core circuit 130B and the set of DET FFs 140B, respectively. Further, the clock signal provided to the set of DET FFs 140B is relabeled as clk_det_1 instead of clk_det as in FIG. 1A.

The data processing circuit 100B further includes a second frequency divider (FD) 170-2 and a fourth multiplexer 120-2. In this case, the third multiplexer 110-2 is configured to select and output a clock signal clk_src2 based on the second clock select signal clk_sel_2. The second frequency divider (FD) 170-2 is configured to frequency divide the clock signal clk_src2 by a divider ratio (e.g., two (2)) to generate a second root clock signal clk_root_2. Via the second set of cascaded buffers 115-2 and clock distribution network 155, a second clock signal clk_det_2 based on the second root clock signal clk_root_2 is provided to the clock inputs of a second set of DET FFs 160B of a second core circuit 150B. The set of DET FFs 140B is coupled to the set of DET FFs 160B via a scan pipeline.

Figure 2A:
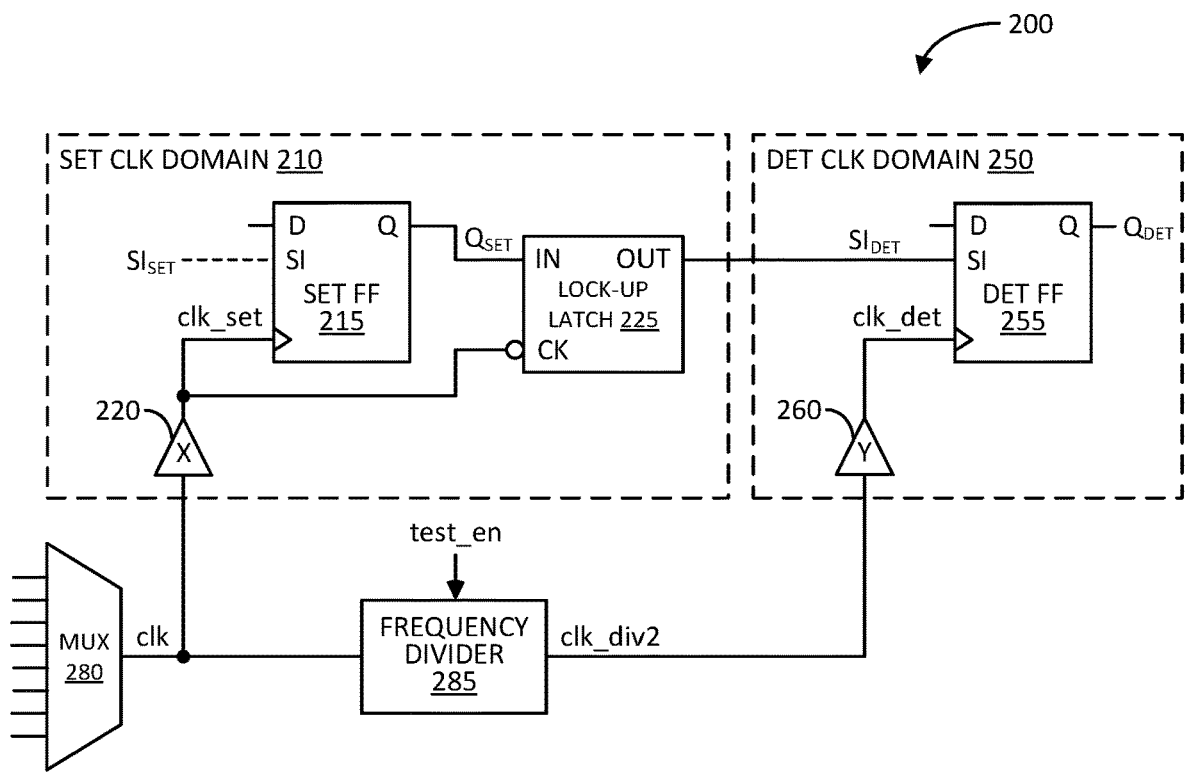
FIG. 2A illustrates a block diagram of an example sequential circuit 200 including a single-edge-triggered (SET) flip-flop (FF) scan interface to a dual-edge-triggered (DET) flip-flop (FF) in accordance with another aspect of the disclosure.

FIG. 2A illustrates a block diagram of an example sequential circuit 200 including a single-edge-triggered (SET) flip-flop (FF) scan pipeline interface to a dual-edge-triggered (DET) flip-flop (FF) in accordance with another aspect of the disclosure. The sequential circuit 200 includes a single-edge-triggered (SET) clock domain 210 coupled to a downstream dual-edge-triggered (DET) clock domain 250. A clock domain as defined herein is a set of sequential circuits driven by a clock signal to propagate data in response to a single edge (e.g., SET FFs) or both edges (e.g., DET FFs) of each period of the clock signal. The SET clock domain 210 includes a SET flip-flop (FF) 215, a clock distribution network or tree (X) 220, and a lock-up latch 225. The DET clock domain 250 includes a DET flip-flop (FF) 255 and a clock distribution network or tree (Y) 260. Further, the sequential circuit 200 may include a clock multiplexer 280 and a frequency divider (FD) 285.

With regard to the SET clock domain 210, the SET flip-flop 215 includes a data (D) input, a scan input (SI), a clock input (>), and an output (Q). The scan input (SI) of the SET flip-flop 215 is configured to receive a scan signal $SI_{SET}$. The clock input (>) of the SET flip-flop 215 is configured to receive a clock signal clk_set. The output (Q) of the SET flip-flop 215, which is configured to output a propagated scan signal $Q_{SET}$, is coupled to an input of the lock-up latch 225.

The lock-up latch 225 includes clock input (CK) configured to receive the clock signal clk_set (e.g., generally a control signal). The clock input (CK) is shown with the inverted symbol to illustrates that the lock-up latch 225 propagates the scan signal $Q_{SET}$ at its input to its output to generate the propagated scan signal $SI_{DET}$ in response to the opposite phase edge (e.g., falling) than the clock edge (e.g., rising) upon which the SET flip-flop 215 responsibly propagates the scan signal $SI_{SET}$ at its scan input (SI) to its output (Q) to generate the propagated scan signal $Q_{SET}$. The clock distribution network or tree (X) 220 is configured to provide the clock signal clk_set to the SET flip-flop 215 and the lock-up latch 225 based on a first root clock signal clk, which may be controllably outputted by a clock multiplexer 280.

With regard to the DET clock domain 250, the DET flip-flop 255 includes a data (D) input, a scan input (SI), a clock input (>), and an output (Q). The scan input (SI) of the DET flip-flop 255 is coupled to the output of the lock-up latch 225 to receive the propagated scan signal $SI_{DET}$. The clock input (>) of the DET flip-flop 255 is configured to receive a clock signal clk_det. The output (Q) of the DET flip-flop 255 is configured to output a propagated scan signal $Q_{DET}$.

The clock distribution network or tree (Y) 260 is configured to provide the clock signal clk_det to the DET flip-flop 255 based on a second root clock signal clk_div2. The sequential circuit 200 may include a frequency divider 285, which may be selectively enabled by a test enable (test_en) signal, configured to generate the second root clock signal clk_div2 by frequency dividing the first root clock signal clk by a specified divider ratio (e.g., substantially two (2)). As the clock signals clk_set and clk_det are in different clock domains, the lock-up latch 225 propagates the scan signal $Q_{SET}$ to generate the propagated scan signal $SI_{DET}$ so that hold time requirements are met for the DET flip-flop 255, as discussed in more detail with reference to the following timing diagram description.

Figure 2B:
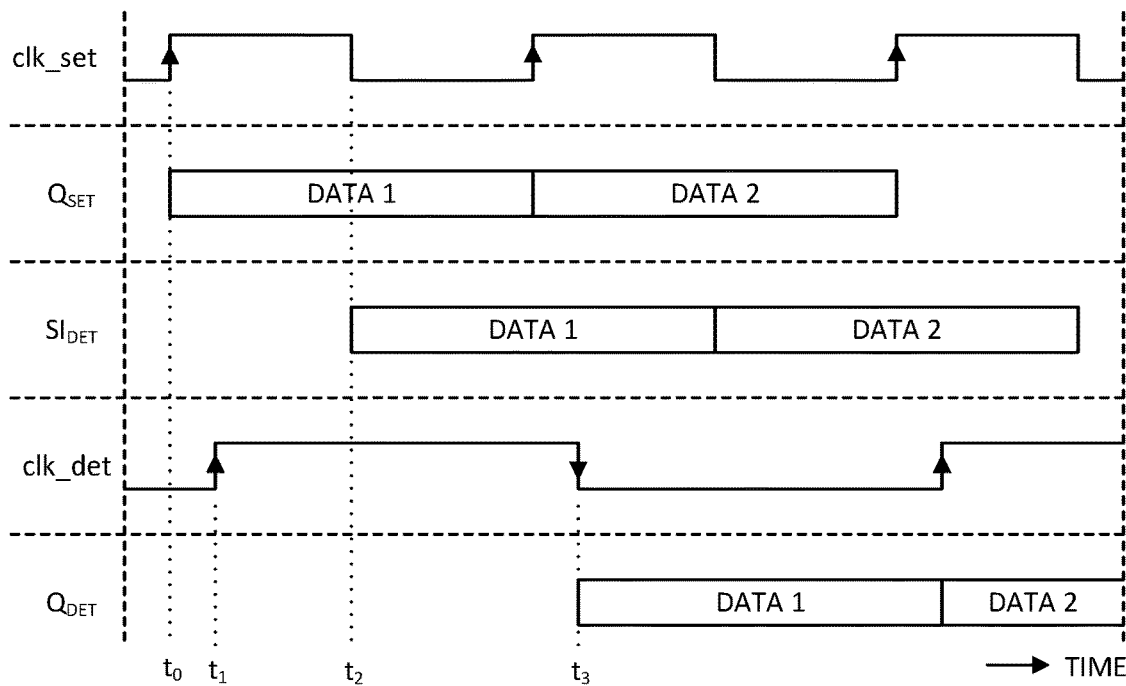
FIG. 2B illustrates a timing diagram of example signals associated with the sequential circuit of FIG. 2A in accordance with another aspect of the disclosure.

FIG. 2B illustrates a timing diagram of example signals associated with the sequential circuit 200 in accordance with another aspect of the disclosure. The horizontal axis of the timing diagram represents time. The vertical axis, from top to bottom, represents the states of the clock signal clk_set, the propagated scan signal $Q_{SET}$, the propagated scan signal $SI_{DET}$, the clock signal clk_det, and the propagated scan signal $Q_{DET}$, respectively.

According to the timing diagram, at time $t_0$, the clock signal clk_set exhibits a clocking (e.g., rising) edge. In response, the SET flip-flop 215 propagates the scan signal $SI_{SET}$ at its scan input (SI) to its output (Q) to generate DATA 1 of the propagated scan signal $Q_{SET}$. As the lock-up latch 225 propagates data from its input to its output in response to the opposite phase edge (e.g., falling) of the clock signal clk_set, the lock-up latch 225 propagates the DATA 1 of the scan signal $Q_{SET}$ to its output to generate the propagated scan signal $SI_{DET}$ at time $t_2$. As indicated, time $t_2$ is about midway between the rising and falling clocking edges of the clock signal clk_det between times $t_1$ and $t_3$, respectively. Thus, the DATA 1 of the propagated scan signal $SI_{DET}$ arrives at the scan input (SI) of the DET flip-flop 255 such that the DET flip-flop 255 is able to propagate the scan signal $SI_{DET}$ to its output (Q) to generate the propagated scan signal $Q_{SET}$ while meeting hold time requirement.

Had the output (Q) of the SET flip-flop 215 been directly coupled to the scan input (SI) of the DET flip-flop 255 (e.g., had the lock-up latch 225 not been included), the rising clocking edge of the clock signal clk_det at time $t_1$ would have attempted to propagate DATA 1 of the scan signal $Q_{SET}$, which may have resulted in a hold time violation and the same DATA 1 may ended up at both outputs (Q) of the SET flip-flop 215 and the DET flip-flop 255 in violation of sequential propagation.

Figure 3A:
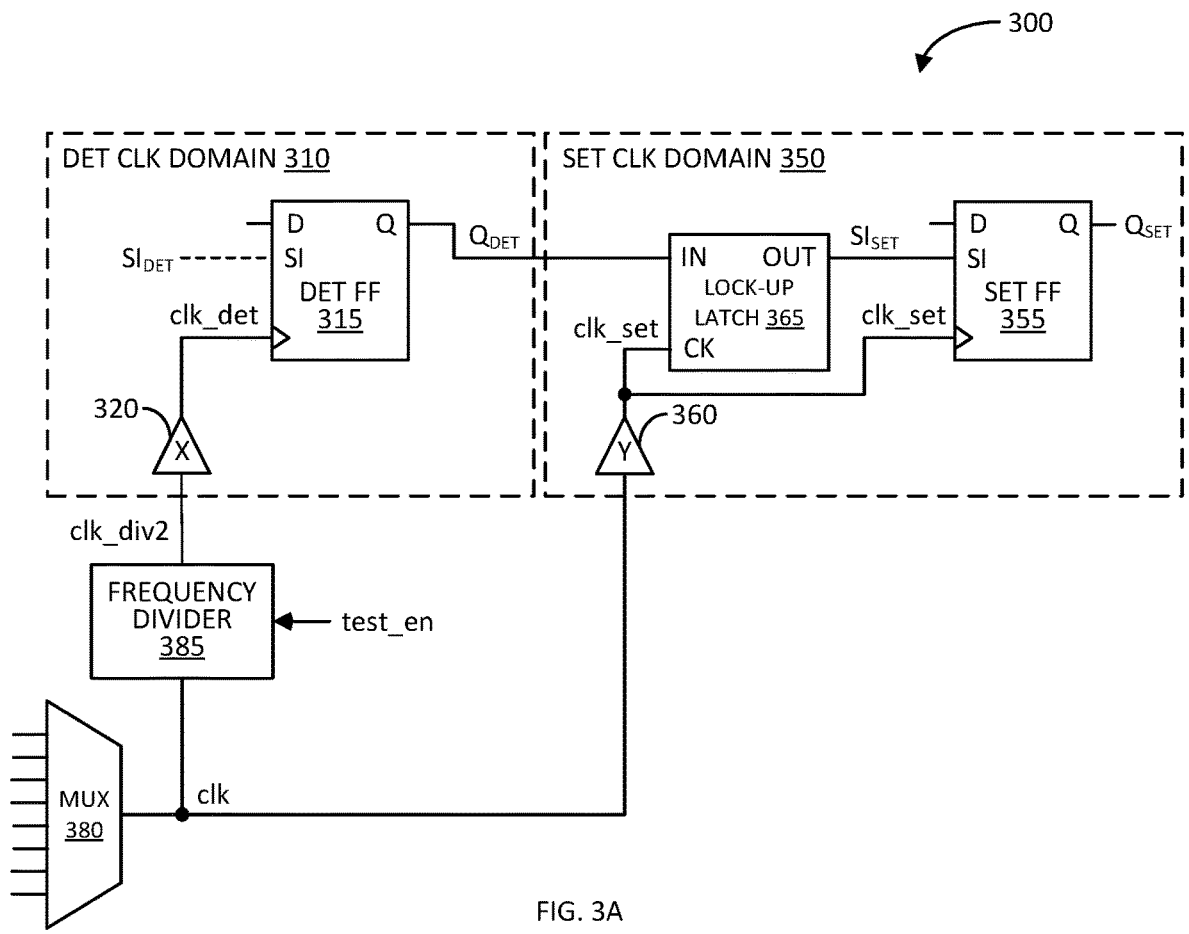
FIG. 3A illustrates a block diagram of another example sequential circuit including a dual-edge-triggered (DET) flip-flop (FF) scan interface to a single-edge-triggered (SET) flip-flop (FF) in accordance with another aspect of the disclosure.

FIG. 3A illustrates a block diagram of another example sequential circuit 300 including a dual-edge-triggered (DET) flip-flop (FF) scan pipeline interface to a single-edge-triggered (SET) flip-flop (FF) in accordance with another aspect of the disclosure. The sequential circuit 300 includes a dual-edge-triggered (DET) clock domain 310 coupled to a downstream single-edge-triggered (SET) clock domain 350. The DET clock domain 310 includes a DET flip-flop (FF) 315 and a clock distribution network or tree (X) 320. The SET clock domain 350 includes a SET flip-flop (FF) 355, a clock distribution network or tree (Y) 360, and a lock-up latch 365. Further, the sequential circuit 300 may include a clock multiplexer 380 and a frequency divider (FD) 385.

With regard to the DET clock domain 310, the DET flip-flop 315 includes a data (D) input, a scan input (SI), a clock input (>), and an output (Q). The scan input (SI) of the DET flip-flop 315 is configured to receive a scan signal $SI_{DET}$. The clock input (>) of the DET flip-flop 315 is configured to receive a clock signal clk_det. The output (Q) of the DET flip-flop 315, which is configured to output a propagated scan signal $Q_{SET}$, is coupled to an input of the lock-up latch 365 in the SET clock domain 350.

The clock multiplexer 380 may be configured to controllably output a first root clock signal clk. The frequency divider 385, which may be selectively enabled by a test enable (test_en) signal, is configured to frequency divide the first root clock signal clk with a specified divider ratio (e.g., two (2)) to generate a second root clock signal clk_div2. The clock distribution network or tree (X) 320 is configured to provide the clock signal clk_det for the DET flip-flop 315 based on the second root clock signal clk_div2.

With regard to the SET clock domain 350, the lock-up latch 365 includes an input coupled to the output (Q) of the DET flip-flop 315 to receive the propagated scan signal $Q_{DET}$. The lock-up latch 365 also includes a clock input (CK) configured to receive a clock signal clk_set (e.g., generally a control signal). The lock-up latch 365 further includes an output coupled to the scan input (SI) of the SET flip-flop 355 to provide thereto the propagated scan signal $SI_{SET}$. The SET flip-flop 355 includes a clock input (>) configured to receive the clock signal clk_set. The SET flip-flop 355 includes an output (Q) configured to output a propagated scan input $Q_{SET}$. The clock distribution network or tree (Y) 360 is configured to provide the clock signal clk_set to the lock-up latch 365 and the SET flip-flop 355 based on the first root clock signal clk.

Similarly, as the clock signals clk_det and clk_set are in different clock domains, the lock-up latch 365 propagates the scan signal $Q_{SET}$ to generate the propagated scan signal $SI_{DET}$ so that hold time requirements are met for the SET flip-flop 355, as discussed in more detail with reference to the following timing diagram description.

Figure 3B:
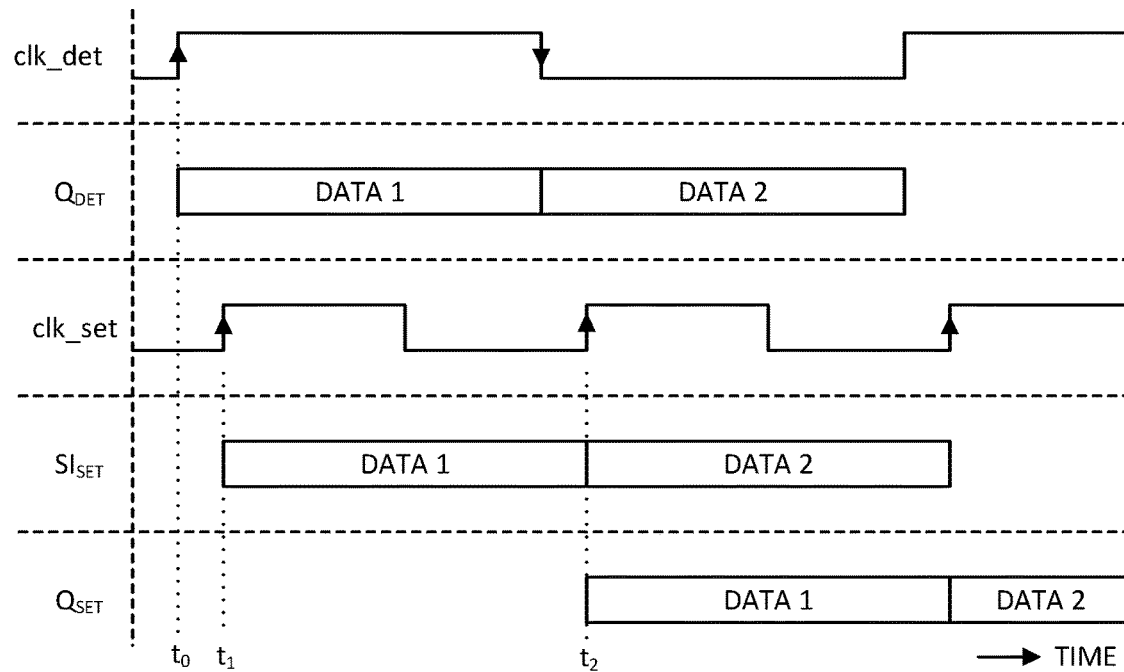
FIG. 3B illustrates a timing diagram of example signals associated with the sequential circuit of FIG. 3A in accordance with another aspect of the disclosure.

FIG. 3B illustrates a timing diagram of example signals associated with the sequential circuit 300 in accordance with another aspect of the disclosure. Similarly, the horizontal axis of the timing diagram represents time. The vertical axis, from top to bottom, represents the states of the clock signal clk_det, the propagated scan signal $Q_{DET}$, the clock signal clk_set, the propagated scan signal $SI_{DET}$, and the propagated scan signal $Q_{SET}$, respectively.

According to the timing diagram, at time t0, the clock signal clk_det exhibits a clocking edge. In response, the DET flip-flop 315 propagates the scan signal $SI_{DET}$ at its scan input (SI) to its output (Q) to generate DATA 1 of the propagated scan signal $Q_{DET}$. Due to a delay between the clocking edge of the clock signal clk_det and the clocking (e.g., rising) edge of the clock signal clk_set at time $t_1$ (e.g., due to difference in the respective delays imparted by the clock distribution networks or trees 320 and 360 upon the root clock signals clk_div2 and clk, respectively), the lock-up latch 365 propagates the DATA 1 of the scan signal $Q_{DET}$ to its output to generate the propagated scan signal $SI_{SET}$ at time $t_1$. As indicated, the time $t_1$ is sufficiently well before the next clocking (e.g., rising) edge of the clock signal clk_set at time $t_2$ upon which the SET flip-flop 355 propagates the DATA 1 of the propagated scan signal $SI_{SET}$ to its output (Q) to generate the DATA 1 of propagated scan signal $Q_{SET}$ at time $t_2$. Thus, the SET FF 355 is able to propagate the scan signal $SI_{DET}$ to its output (Q) in compliance with hold time requirements.

Had the output (Q) of the DET flip-flop 315 been directly coupled to the scan input (SI) SET flip-flop 355 (e.g., had the lock-up latch 365 not been included), the clocking edge of the second clock signal clk_set at time $t_1$ would have attempted to propagate DATA 1 of the scan signal $Q_{DET}$, which may have resulted in a hold time violation and the same DATA 1 may ended up at both outputs (Q) of the DET flip-flop 315 and the SET flip-flop 355 in violation of sequential propagation.

Figure 4A:
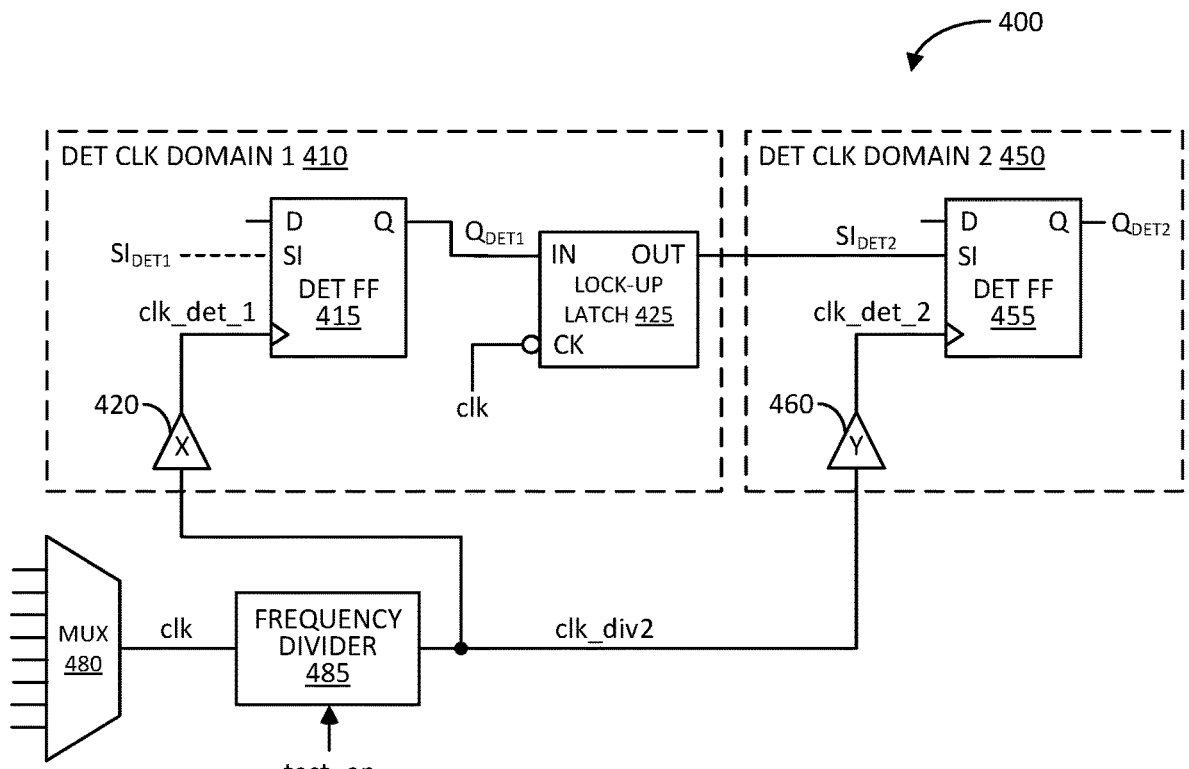
FIG. 4A illustrates a block diagram of another example sequential circuit including a dual-edge-triggered (DET) flip-flop (FF) scan interface to a dual-edge-triggered (SET) flip-flop (FF) in accordance with another aspect of the disclosure.

FIG. 4A illustrates a block diagram of another example sequential circuit 400 including a dual-edge-triggered (DET) flip-flop (FF) scan pipeline interface to a dual-edge-triggered (DET) flip-flop (FF) in accordance with another aspect of the disclosure. The sequential circuit 400 includes a first dual-edge-triggered (DET) clock domain 410 coupled to a downstream second dual-edge-triggered (DET) clock domain 450. The first DET clock domain 410 includes a DET flip-flop (FF) 415, a clock distribution network or tree (X) 420, and a lock-up latch 425. The second DET clock domain 450 includes a DET flip-flop (FF) 455 and a clock distribution network or tree (Y) 460. Further, the sequential circuit 400 may include a clock multiplexer 480 and a frequency divider (FD) 485.

With regard to the first DET clock domain 410, the DET flip-flop 415 includes a data (D) input, a scan input (SI), a clock input (>), and an output (Q). The scan input (SI) of the DET flip-flop 415 is configured to receive a scan signal $SI_{DET1}$. The clock input (>) of the DET flip-flop 415 is configured to receive a clock signal clk_det_1. The output (Q) of the DET flip-flop 415, which is configured to output a propagated scan signal $Q_{DET1}$, is coupled to an input of the lock-up latch 425.

The lock-up latch 425 includes a clock input (CK) configured to receive a clock signal clk (e.g., generally a control signal), which may be outputted by the clock multiplexer 480. The clock input (CK) is shown with the inverted symbol to illustrates that the lock-up latch 425 propagates the scan signal $Q_{DET1}$ at its input to its output to generate the propagated scan signal $SI_{DET2}$ in response to opposite phase edge (e.g., falling) of the clocking edge (e.g., rising) of the clock signal clk, wherein the rising edge of the clock signal clk_det_1 is derived from the rising edge of the clock signal clk. The frequency divider 485, which may be controllably enabled via a test enable (test_en) signal, is configured to frequency divide the first root clock signal clk by a divider ratio (e.g., two (2)) to generate a second root clock signal clk_div2. The clock distribution network or tree (X) 420 is configured to provide the clock signal clk_det_1 to the DET flip-flop 415 based on the root clock signal clk_div2.

With regard to the second DET clock domain 450, the DET flip-flop 455 includes a data (D) input, a scan input (SI), a clock input (>), and an output (Q). The scan input (SI) of the DET flip-flop 455 is configured to receive the propagated scan signal $SI_{SET2}$ from the output of the lock-up latch 425. The clock input (>) of the DET flip-flop 455 is configured to receive a clock signal clk_det_2. The clock distribution network or tree (Y) 460 is configured to provide the clock signal clk_det_2 to the DET flip-flop 455 based on the second root clock signal clk_div2. The output (Q) of the DET FF 455 is configured to output the propagated scan signal $Q_{DET2}$.

As the clock signals clk_det and clk_det are in different clock domains, the lock-up latch 425 propagates the scan signal $Q_{DET1}$ to generate the propagated scan signal $SI_{DET2}$ so that hold time requirements are met for the DET flip-flop 455, as discussed in more detail with reference to the following timing diagram description.

Figure 4B:
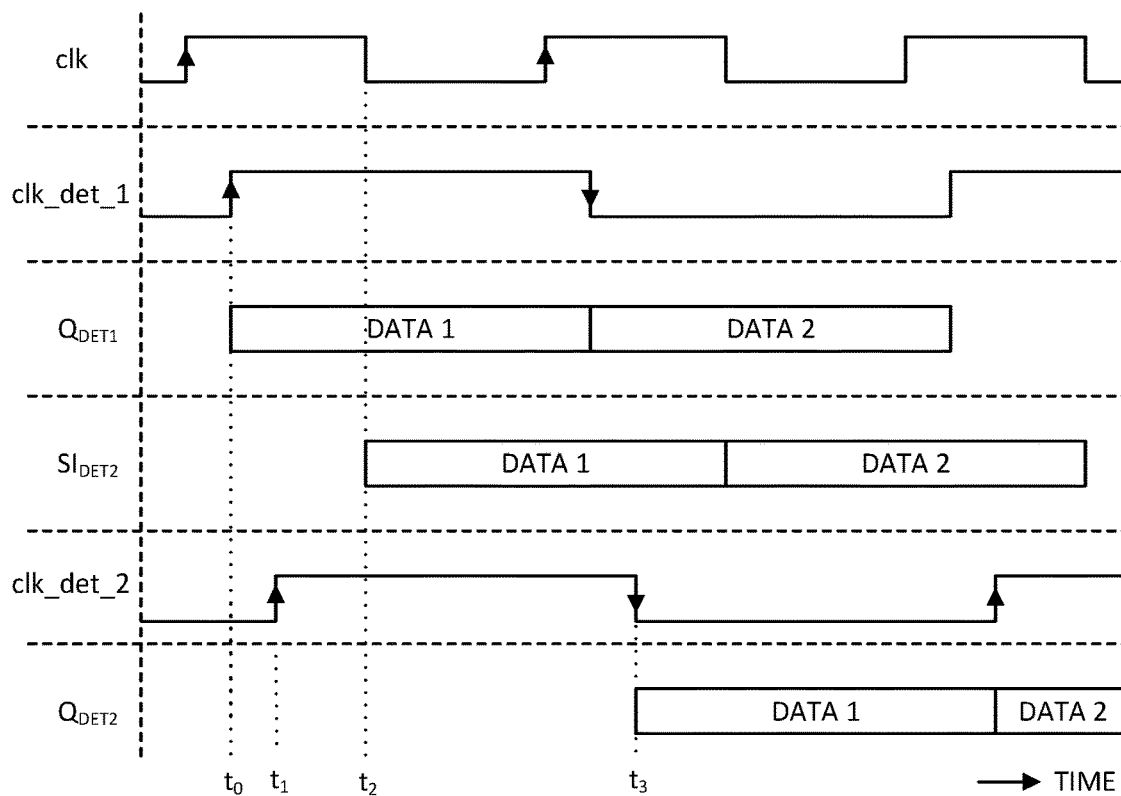
FIG. 4B illustrates a timing diagram of example signals associated with the sequential circuit of FIG. 4A in accordance with another aspect of the disclosure.

FIG. 4B illustrates a timing diagram of example signals associated with the sequential circuit 400 in accordance with another aspect of the disclosure. Similarly, the horizontal axis of the timing diagram represents time. The vertical axis, from top to bottom, represents the states of the clock signal clk, the clock signal clk_det_1, the propagated scan signal $Q_{DET1}$, the propagated scan signal $SI_{DET2}$, the clock signal clk_det_2, and the propagated scan signal $Q_{DET2}$, respectively.

According to the timing diagram, at time t0, the clock signal clk_det_1 exhibits a clocking edge. In response, the DET flip-flop 415 propagates the scan signal $SI_{DET1}$ at its scan input (SI) to its output (Q) to generate DATA 1 of the propagated scan signal $Q_{DET1}$. As the lock-up latch 425 propagates data from its input to its output in response to the opposite phase edge (e.g., falling) of the clock signal clk, the lock-up latch 425 propagates the DATA 1 of the scan signal $Q_{DET1}$ to its output to generate the propagated scan signal $SI_{DET2}$ at time $t_2$. As indicated, time $t_2$ is well before the clocking edge of the clock signal clk_det_2 at time $t_3$. Thus, the DATA 1 of the propagated scan signal $SI_{DET2}$ arrives at the scan input (SI) of the DET flip-flop 455 such that the DET flip-flop 455 is able to propagate the scan signal $SI_{DET2}$ to its output (Q) to generate the propagated scan signal $Q_{DET2}$ while meeting hold time requirement.

Had the output (Q) of the DET flip-flop 415 been directly coupled to the scan input (SI) of the DET flip-flop 455 (e.g., had the lock-up latch 425 not been included), the clocking edge of the clock signal clk_det_2 at time $t_1$ would have attempted to propagate DATA 1 of the scan signal $Q_{DET1}$, which may have resulted in a hold time violation and the same DATA 1 may ended up at both outputs (Q) of the DET flip-flop 415 and the DET flip-flop 455 in violation of sequential propagation.

Figure 5A:
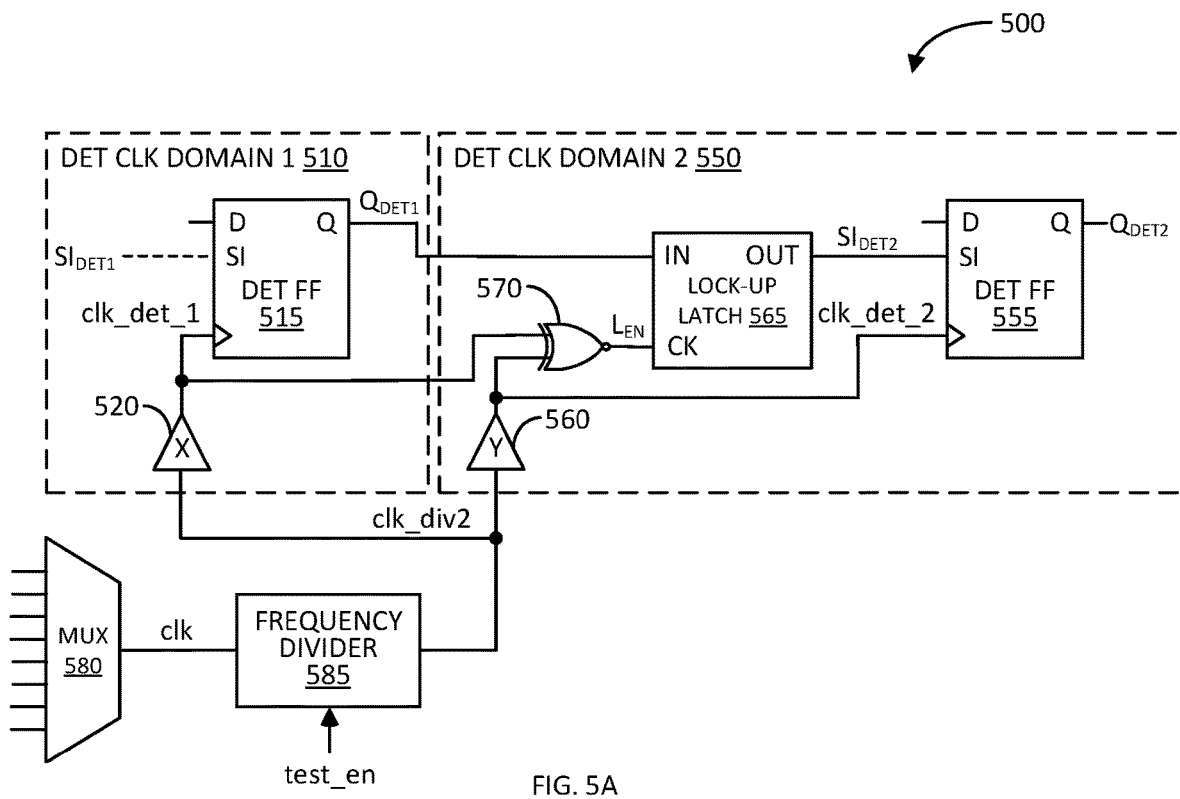
FIG. 5A illustrates a block diagram of another example sequential circuit including a dual-edge-triggered (DET) flip-flop (FF) scan interface to a dual-edge-triggered (SET) flip-flop (FF) in accordance with another aspect of the disclosure.

FIG. 5A illustrates a block diagram of another example sequential circuit 500 including a dual-edge-triggered (DET) flip-flop (FF) scan pipeline interface to a dual-edge-triggered (DET) flip-flop (FF) in accordance with another aspect of the disclosure. The sequential circuit 500 includes a dual-edge-triggered (DET) clock domain 510 coupled to a downstream dual-edge-triggered (DET) clock domain 550. The DET clock domain 510 includes a DET flip-flop (FF) 515 and a clock distribution network or tree (X) 520. The DET clock domain 550 includes a DET flip-flop (FF) 555, a clock distribution network or tree (Y) 560, a lock-up latch 565, and a logic circuit (e.g., exclusive-NOR (XNOR) gate) 570. Further, the sequential circuit 500 may include a clock multiplexer 580 and a frequency divider (FD) 585.

With regard to the DET clock domain 510, the DET flip-flop 515 includes a data (D) input, a scan input (SI), a clock input (>), and an output (Q). The scan input (SI) of the DET flip-flop 515 is configured to receive a scan signal $SI_{DET1}$. The clock input (>) of the DET flip-flop 515 is configured to receive a clock signal clk_det_1. The output (Q) of the DET flip-flop 515, which is configured to output a propagated scan signal $Q_{DET1}$, is coupled to an input of the lock-up latch 565 in the DET clock domain 550.

The clock multiplexer 580 may be configured to controllably output a first root clock signal clk. The frequency divider 585, which may be selectively enabled by a test enable (test_en) signal, is configured to frequency divide the first root clock signal clk with a specified divider ratio (e.g., two (2)) to generate a second root clock signal clk_div2. The clock distribution network or tree (X) 520 is configured to provide the clock signal clk_det_1 for the DET flip-flop 515 based on the second root clock signal clk_div2.

With regard to the DET clock domain 550, the lock-up latch 365 includes an input coupled to the output (Q) of the DET flip-flop 515 to receive the propagated scan signal $Q_{DET1}$. The lock-up latch 565 also includes a clock input (CK) coupled to an output of the XNOR gate 570 to receive a control signal LEN. The XNOR gate 570 includes inputs configured to receive the clock signals clk_det_1 and clk_det_2, respectively. The lock-up latch 565 further includes an output coupled to the scan input (SI) of the DET flip-flop 555 to provide thereto the propagated scan signal $SI_{DET2}$. The DET flip-flop 555 includes a clock input (>) configured to receive the clock signal clk_det_2. The DET flip-flop 555 includes an output (Q) configured to output a propagated scan input $Q_{DET2}$. The clock distribution network or tree (Y) 560 is configured to provide the clock signal clk_det_2 to the corresponding input of the XNOR gate 570 based on the second root clock signal clk_div2.

Similarly, as the clock signals clk_det_1 and clk_det_2 are in different clock domains, the lock-up latch 565 propagates the scan signal $Q_{DET1}$ to generate the propagated scan signal $SI_{DET2}$ so that hold time requirements are met for the DET flip-flop 555, as discussed in more detail with reference to the following timing diagram description.

Figure 5B:
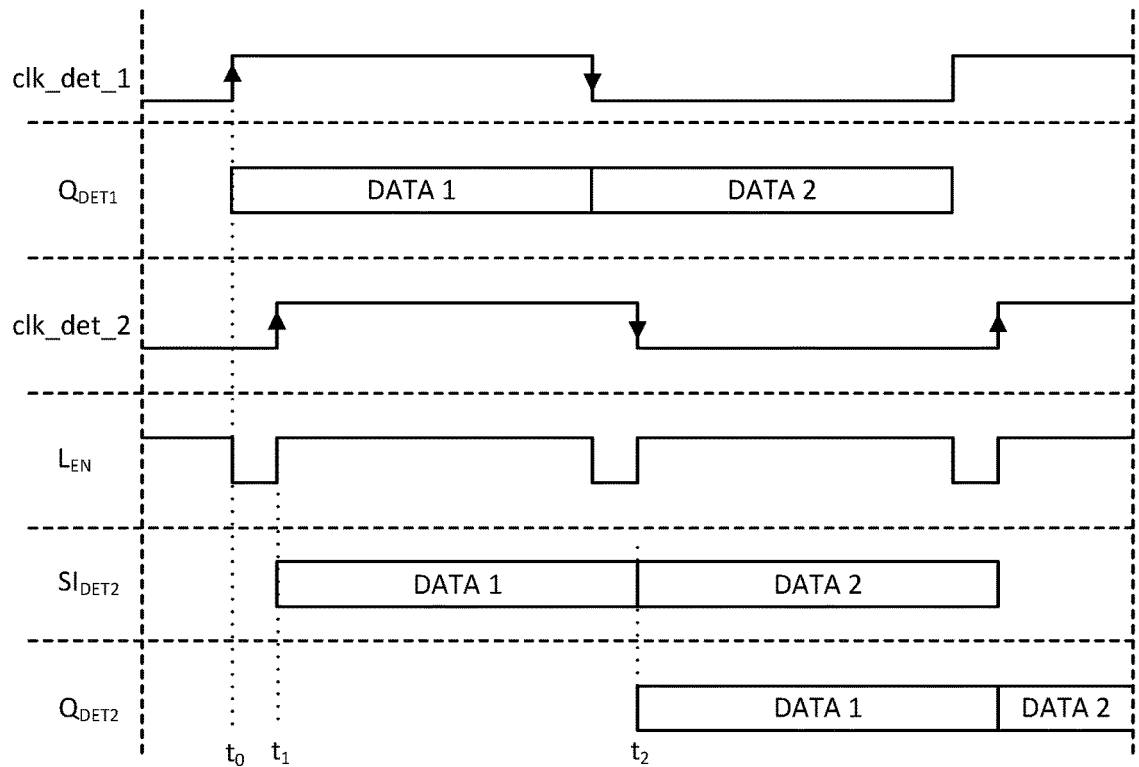
FIG. 5B illustrates a timing diagram of example signals associated with the sequential circuit of FIG. 5A in accordance with another aspect of the disclosure.

FIG. 5B illustrates a timing diagram of example signals associated with the sequential circuit 500 in accordance with another aspect of the disclosure. Similarly, the horizontal axis of the timing diagram represents time. The vertical axis, from top to bottom, represents the states of the clock signal clk_det_1, the propagated scan signal $Q_{DET1}$, the clock signal clk_det_2, the control signal LEN, the propagated scan signal $SI_{DET2}$, and the propagated scan signal $Q_{DET2}$, respectively.

According to the timing diagram, at time to, the clock signal clk_det_1 exhibits a clocking edge. In response, the DET flip-flop 515 propagates the scan signal $SI_{DET1}$ at its scan input (SI) to its output (Q) to generate DATA 1 of the propagated scan signal $Q_{DET1}$. At time to, the clock signals clk_det_1 and clk_det_2 are at high and low phases, respectively. Accordingly, the XNOR gate 570 generates the control signal LEN as a logic zero (0). When the clock signal clk_det_2 becomes high at time $t_1$, the XNOR gate 570 generates the control signal LEN as a logic one (1) (e.g., exhibits a rising edge). In response, the lock-up latch 565 propagates the DATA 1 of the scan signal $Q_{DET1}$ to its output to generate the propagated scan signal $SI_{DET1}$ at time $t_1$. As indicated, the time $t_1$ is sufficiently well before the next clocking edge of the clock signal clk_det_2 at time $t_2$ upon which the DET flip-flop 555 propagates the DATA 1 of the propagated scan signal $SI_{DET2}$ to its output (Q) to generate the DATA 1 of propagated scan signal $Q_{DET2}$ at time $t_2$. Thus, the DET flip-flop 555 is able to propagate the scan signal $SI_{DET}$ to its output (Q) in compliance with hold time requirements.

Had the output (Q) of the DET flip-flop 515 been directly coupled to the scan input (SI) DET flip-flop 555 (e.g., had the lock-up latch 565 not been included), the clocking edge of the clock signal clk_det_2 at time $t_1$ would have attempted to propagate DATA 1 of the scan signal $Q_{DET1}$, which may have resulted in a hold time violation and the same DATA 1 may ended up at both outputs (Q) of the DET flip-flop 515 and the DET flip-flop 555 in violation of sequential propagation.

Figure 6:
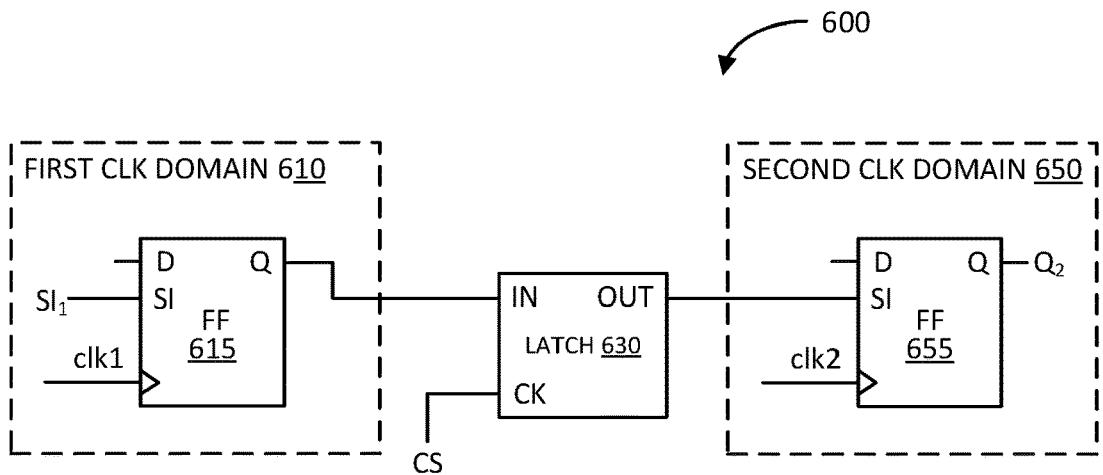
FIG. 6 illustrates a block diagram of an example sequential circuit including a first clock domain flip-flop (FF) scan interface to a second clock domain flip-flop (FF) in accordance with another aspect of the disclosure.

FIG. 6 illustrates a block diagram of an example sequential circuit 600 in accordance with another aspect of the disclosure. The sequential circuit 600 includes a first flip-flop 615 including a scan input (SI) configured to receive a scan signal $SI_1$, a clock input (<) configured to receive a first clock signal clk1 of a first clock domain 610; a latch 630 including an input coupled to an output (Q) of the first flip-flop 615, a clock input configured to receive a control signal CS; and a second flip-flop 655 including a scan input (SI) coupled to an output of the latch 630, a clock input configured to receive a second clock signal clk2 of a second clock domain 650, and an output (Q) configured to generate the scan signal $Q_2$, wherein at least one of the first or second flip-flop 615 OR 655 includes a first dual-edge-triggered (DET) flip-flop.

Figure 7:
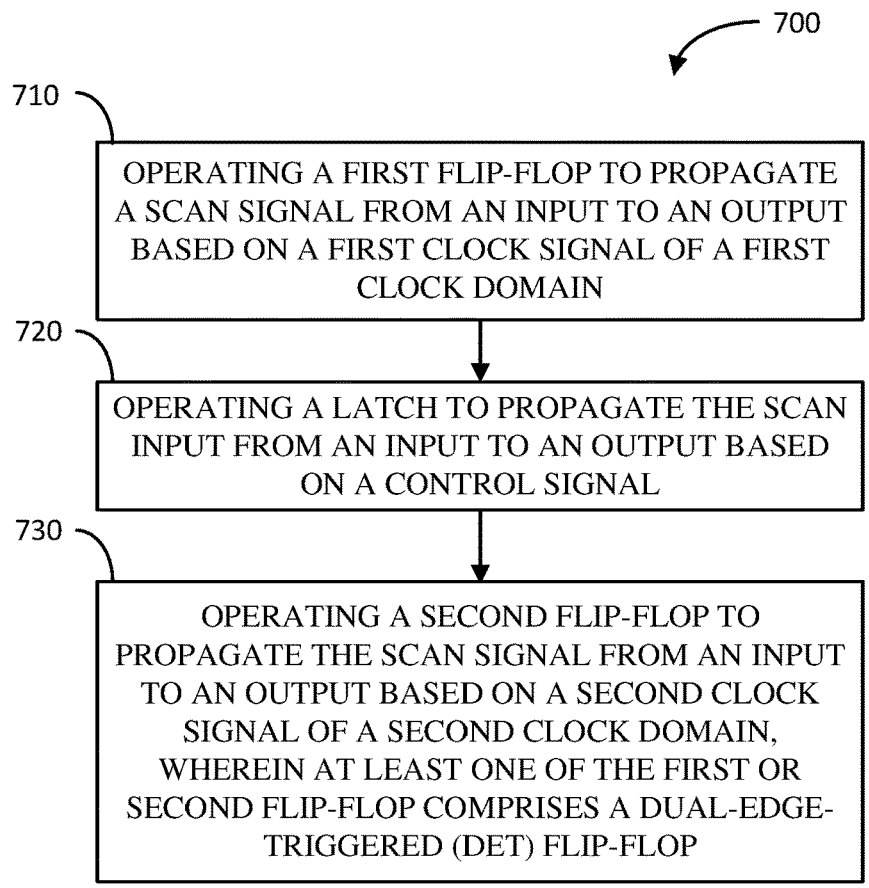
FIG. 7 illustrates a flow diagram of an example method of propagating a scan signal from a first clock domain to a second clock domain in accordance with another aspect of the disclosure.

FIG. 7 illustrates a flow diagram of an example method 700 of propagating a scan signal from a first clock domain to a second clock domain in accordance with another aspect of the disclosure. The method 700 includes operating a first flip-flop to propagate a scan signal from an input to an output based on a first clock signal of a first clock domain (block 710). The method 700 further includes operating a latch to propagate the scan input from an input to an output based on a control signal (block 720). Further, the method 700 includes operating a second flip-flop to propagate the scan signal from an input to an output based on a second clock signal of a second clock domain, wherein at least one of the first or second flip-flop comprises a dual-edge-triggered (DET) flip-flop (block 730).

Figure 8:
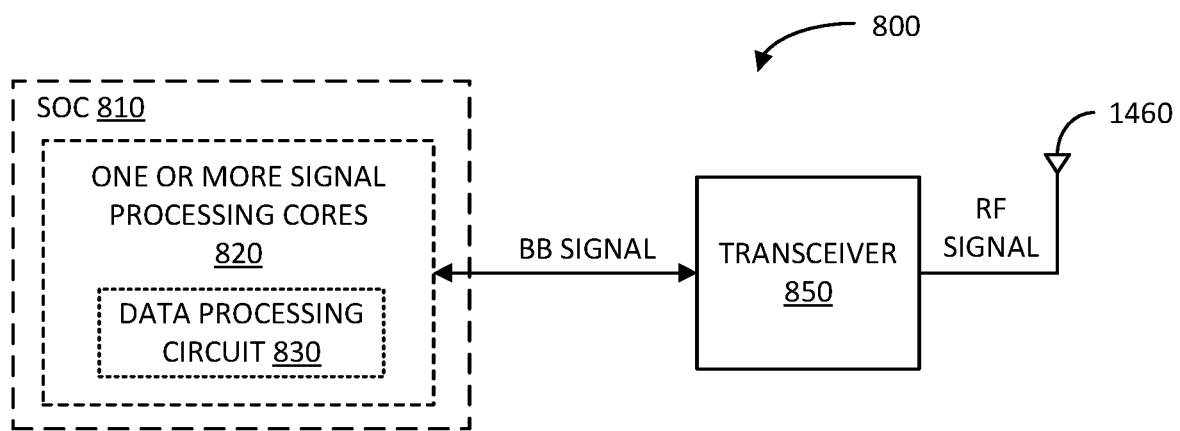
FIG. 8 illustrates a block diagram of an example wireless communication device in accordance with another aspect of the disclosure.

FIG. 8 illustrates a block diagram of an example wireless communication device 800 in accordance with another aspect of the disclosure. The wireless communication device 800 may be a smart phone, a desktop computer, laptop computer, tablet device, Internet of Things (IoT), wearable wireless device (e.g., wireless watch), and other types of wireless device.

In particular, the wireless communication device 800 includes an integrated circuit (IC), which may be implemented as a system on chip (SOC) 810. The SOC 810 includes one or more signal processing cores 820 including a data processing circuit 830. The one or more signal processing cores 820 may be configured to generate a transmit baseband (BB) signal and process a received baseband (BB) signal using the data processing circuit 830. The data processing circuit 830 may be based on data processing circuit 100, and include any one or more of the sequential circuits 200, 300, 400, 500, and 600 described herein.

The wireless communication device 800 may further include a transceiver 850 and at least one antenna 860 (e.g., an antenna array). The transceiver 850 is coupled to the one or more signal processing cores 820 to receive therefrom the transmit BB signal and provide thereto the received BB signal. The transceiver 850 is configured to convert the transmit BB signal into a transmit radio frequency (RF) signal, and convert a received RF signal into the received BB signal. The transceiver 850 is coupled to the at least one antenna 860 to provide thereto the transmit RF signal for electromagnetic radiation into a wireless medium for wireless transmission, and receive the received RF signal electromagnetically picked up from the wireless medium by the at least one antenna 860.

The following provides an overview of aspects of the present disclosure:

Aspect 1: An apparatus, comprising: a first flip-flop including a scan input configured to receive a scan signal, a clock input configured to receive a first clock signal of a first clock domain; a latch including an input coupled to an output of the first flip-flop, a clock input configured to receive a control signal; and a second flip-flop including a scan input coupled to an output of the latch, a clock input configured to receive a second clock signal of a second clock domain, and an output configured to generate the scan signal, wherein at least one of the first or second flip-flop comprises a first dual-edge-triggered (DET) flip-flop.

Aspect 2: The apparatus of aspect 1, wherein the first flip-flop comprises a single-edge-triggered (SET) flip-flop.

Aspect 3: The apparatus of aspect 2, wherein the control signal comprises the first clock signal.

Aspect 4: The apparatus of aspect 3, wherein the second flip-flop comprises the first DET flip-flop.

Aspect 5: The apparatus of aspect 4, further comprising a frequency divider configured to frequency divide a first root clock signal to generate a second root clock signal, wherein the first clock signal is based on the first root clock signal, and wherein the second clock signal is based on the second root clock signal.

Aspect 6: The apparatus of aspect 5, wherein a divider ratio of the frequency divider is substantially two (2).

Aspect 7: The apparatus of aspect 1, wherein the first flip-flop comprises the DET flip-flop.

Aspect 8: The apparatus of aspect 7, wherein the second flip-flop comprises a single-edge-triggered (SET) flip-flop.

Aspect 9: The apparatus of aspect 8, wherein the control signal comprises the second clock signal.

Aspect 10: The apparatus of aspect 9, further comprising a frequency divider configured to frequency divide a first root clock signal to generate a second root clock signal, wherein the first clock signal is based on the second root clock signal, and wherein the second clock signal is based on the first root clock signal.

Aspect 11: The apparatus of aspect 10, wherein a divider ratio of the frequency divider is substantially two (2).

Aspect 12: The apparatus of aspect 1, wherein the first flip-flop comprises the first DET flip-flop.

Aspect 13: The apparatus of aspect 12, wherein the second flip-flop comprises a second dual-edge-triggered (DET) flip-flop.

Aspect 14: The apparatus of aspect 13, wherein the control signal comprises a third clock signal.

Aspect 15: The apparatus of aspect 14, further comprising a frequency divider configured to frequency divide a third root clock signal to generate a second root clock signal, wherein the first and second clock signals are based on the second root clock signal, and wherein the third clock signal is based on the third root clock signal.

Aspect 16: The apparatus of aspect 15, wherein a divider ratio of the frequency divider is substantially two (2).

Aspect 17: The apparatus of aspect 1, wherein the first flip-flop comprises the first DET flip-flop.

Aspect 18: The apparatus of aspect 17, wherein the second flip-flop comprises a second dual-edge-triggered (DET) flip-flop.

Aspect 19: The apparatus of aspect 18, further comprising a logic circuit configured to generate the control signal for the latch based on the first and second clock signals.

Aspect 20: The apparatus of aspect 19, wherein the logic circuit is configured to perform an exclusive OR logic operation on the first and second clock signals to generate the control signal.

Aspect 21: The apparatus of aspect 20, further comprising a frequency divider configured to frequency divide a first root clock signal to generate a second root clock signal, wherein the first and second clock signals are based on the second root clock signal.

Aspect 22: The apparatus of aspect 21, wherein a divider ratio of the frequency divider is substantially two (2).

Aspect 23: A method, comprising: operating a first flip-flop to propagate a scan signal from an input to an output based on a first clock signal of a first clock domain; operating a latch to propagate the scan input from an input to an output based on a control signal; and operating a second flip-flop to propagate the scan signal from an input to an output based on a second clock signal of a second clock domain, wherein at least one of the first or second flip-flop comprises a first dual-edge-triggered (DET) flip-flop.

Aspect 24: The method of aspect 23, wherein the first flip-flop comprises a single-edge-triggered (SET) flip-flop, wherein the second flip-flop comprises the first DET flip-flop, and wherein the control signal comprises the first clock signal.

Aspect 25: The method of aspect 23, wherein the first flip-flop comprises the first DET flip-flop, wherein the second flip-flop comprises a single-edge-triggered (SET) flip-flop, and wherein the control signal comprises the second clock signal.

Aspect 26: The method of aspect 23, wherein the first flip-flop comprises the first DET flip-flop, wherein the second flip-flop comprises a second dual-edge-triggered (DET) flip-flop, and wherein the control signal comprises a third clock signal.

Aspect 27: The method of aspect 23, wherein the first flip-flop comprises the first DET flip-flop, wherein the second flip-flop comprises a second dual-edge-triggered (DET) flip-flop, and further comprising a logic circuit configured to generate the control signal for the latch based on the first and second clock signals.

Aspect 28: The method of aspect 27, wherein the logic circuit is configured to perform an exclusive OR logic operation on the first and second clock signals to generate the control signal.

Aspect 29: The method of any one of aspects 23-28, further comprising frequency dividing a first root clock signal to generate a second root clock signal, wherein the first or second clock signal is based on the second root clock signal.

Aspect 30: A wireless communication device, comprising: at least one antenna; a transceiver coupled to the at least one antenna; and one or more signal processing cores coupled to the transceiver, wherein the one or more signal processing core comprise: a first flip-flop including a scan input configured to receive a scan signal, a clock input configured to receive a first clock signal of a first clock domain; a latch including an input coupled to an output of the first flip-flop, a clock input configured to receive a control signal; and a second flip-flop including a scan input coupled to an output of the latch, a clock input configured to receive a second clock signal of a second clock domain, and an output configured to generate the scan signal, wherein at least one of the first or second flip-flop comprises a first dual-edge-triggered (DET) flip-flop.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
    a first flip-flop including a scan input configured to receive a scan signal, a clock input configured to receive a first clock signal of a first clock domain;
    a latch including an input coupled to an output of the first flip-flop, a clock input configured to receive a control signal; and
    a second flip-flop including a scan input coupled to an output of the latch, a clock input configured to receive a second clock signal of a second clock domain, and an output configured to generate the scan signal,
    wherein one of the first or second flip-flop comprises a dual-edge-triggered (DET) flip-flop, and
    wherein the other of the first or second flip-flop comprises a single-edge-triggered (SET) flip-flop.

2. The apparatus of claim 1, wherein the first flip-flop comprises the SET flip-flop.

3. The apparatus of claim 2, wherein the control signal comprises the first clock signal.

4. The apparatus of claim 3, further comprising a frequency divider configured to frequency divide a first root clock signal to generate a second root clock signal, wherein the first clock signal is based on the first root clock signal, and wherein the second clock signal is based on the second root clock signal.

5. The apparatus of claim 4, wherein a divider ratio of the frequency divider is substantially two (2).

6. The apparatus of claim 1, wherein the second flip-flop comprises a single-edge-triggered (SET) flip-flop.

7. The apparatus of claim 6, wherein the control signal comprises the second clock signal.

8. The apparatus of claim 7, further comprising a frequency divider configured to frequency divide a first root clock signal to generate a second root clock signal, wherein the first clock signal is based on the second root clock signal, and wherein the second clock signal is based on the first root clock signal.

9. The apparatus of claim 8, wherein a divider ratio of the frequency divider is substantially two (2).

10. A method, comprising:
    operating a first flip-flop to propagate a scan signal from an input to an output based on a first clock signal of a first clock domain;
    operating a latch to propagate the scan input from an input to an output based on a control signal; and
    operating a second flip-flop to propagate the scan signal from an input to an output based on a second clock signal of a second clock domain, wherein one of the first or second flip-flop comprises a dual-edge-triggered (DET) flip-flop, and
    wherein the other of the first or second flip-flop comprises a single-edge-triggered (SET) flip-flop.

11. The method of claim 10, wherein the first flip-flop comprises the SET e flip-flop, wherein the second flip-flop comprises the DET flip-flop, and wherein the control signal comprises the first clock signal.

12. The method of claim 10, wherein the first flip-flop comprises the DET flip-flop, wherein the second flip-flop comprises the SET flip-flop, and wherein the control signal comprises the second clock signal.

13. A wireless communication device, comprising:
    at least one antenna;
    a transceiver coupled to the at least one antenna; and
    one or more signal processing cores coupled to the transceiver, wherein the one or more signal processing cores comprise:
        a first flip-flop including a scan input configured to receive a scan signal, a clock input configured to receive a first clock signal of a first clock domain;
        a latch including an input coupled to an output of the first flip-flop, a clock input configured to receive a control signal; and
        a second flip-flop including a scan input coupled to an output of the latch, a clock input configured to receive a second clock signal of a second clock domain, and an output configured to generate the scan signal,
        wherein one of the first or second flip-flop comprises a dual-edge-triggered (DET) flip-flop, and
        wherein the other of the first or second flip-flop comprises a single-edge-triggered (SET) flip-flop.

* * * * *